United States Patent [19]

Whitaker

[11] 3,974,444

[45] Aug. 10, 1976

[54] COMBINED DISPLAY AND RANGE SELECTOR FOR USE WITH DIGITAL INSTRUMENTS EMPLOYING THE BINARY NUMBERING SYSTEM

[76] Inventor: Ronald O. Whitaker, c/o Rowco Engineering Co., 4719 Squire Drive, Indianapolis, Ind. 46241

[22] Filed: Feb. 24, 1975

[21] Appl. No.: 552,177

[52] U.S. Cl. .............................................. 324/115
[51] Int. Cl.² ..................................... G01R 15/08
[58] Field of Search.................. 324/115, 99 D, 131

[56] References Cited
UNITED STATES PATENTS 3,237,102  2/1966  Newell ................................ 324/115
3,350,639  10/1967  Hulman et al. ..................... 324/115

*Primary Examiner*—R. V. Rolinec
*Assistant Examiner*—Ernest F. Karlsen

[57] ABSTRACT

The faceplate of the display system carries the outlines of a sequence of computer compatible digits. Each digit consists of four binary weighted line segments, each segment is associated with a hole in the faceplate. Holes are in line and equally spaced. Behind the faceplate a slide bearing Leds moves along the line of holes. For each operating position the Leds appear behind a set of successive holes. The Leds receive the digital output of the instrument. The arrangement is such that movement of the slide by one position changes the scale by a factor of two. A switch associated with the slide causes the measuring range of an associated instrument to be simultaneously changed by that same factor of two.

5 Claims, 10 Drawing Figures

COMBINED DISPLAY AND RANGE SELECTOR FOR USE WITH DIGITAL INSTRUMENTS EMPLOYING THE BINARY NUMBERING SYSTEM

RELATED APPLICATION

This application is an extension of principles covered in application Ser. No. 403 873.

BACKGROUND OF THE INVENTION

Our Arabic decimal system of numbering has served us well for nearly 2,000 years. However, the advantages of digital instruments using the binary numbering system indicate that the Arabic system should be permitted to pass into honored retirement. Typical of the instruments which can advantageously use the binary system is the 8 bit digital voltmeter. It may be compared with an 8-bit decimal unit. The decimal unit must change scales by a factor of 10. The binary unit may change scales by a factor of 2. Consequently:

|  | Decimal | Binary |
| --- | --- | --- |
| Maximum Count | 99 | 255 |
| Consequent Best Resolution | 1% | 0.4% |
| Minimum Count | 10 | 128 |
| Consequent Worst Resolution | 10% | 0.8% |

A voltmeter having a resolution of 10% would hardly be useful for any purpose. Consequently two-digit decimal voltmeters are not made. But a voltmeter having a worst case resolution of 0.8% can be very useful. Consequently many 8-bit A/D converters are in use today. They are less costly than their decimal counterparts. Their performance is vastly superior. In this case it is clear that the decimal system should be dropped in favor of the binary system. The present invention drops the decimal system and introduces new tecniques which exploit fully the advantages of the binary system.

The chief object to use of the binary system is the proliferation of digits which must be quoted. In the voltmeter case cited above only two words must be uttered to express the voltage in decimal units. Eight words are necessary if the binary system is used. This shortcoming of the binary system is overcome in the present invention by adopting the base-16 numbering system. Binary digits may be grouped in groups of four to form base-16 digits. A number expressed in base-16 will generally consist of fewer words than the same number expressed in decimal units.

SUMMARY OF THE INVENTION

The invention provides a means for changing the scale of a digital display by successive factors of 2 and simultaneously changing the range of an associated measuring instrument by the same successive factors of 2. This prevents the possibility of error in reading the measuring instrument. The display uses 4-bit "computer compatible" digits discussed in detail in copending U.S. Pat. application Ser. No. 403 873. The outputs of an 8-bit A/D converter are fed to eight LED's positioned in line and equally spaced on a slide. The slide is mounted behind a faceplate bearing the ccd's (computer compatible digits). Associated with each binary element of each digit is a hole in the faceplate. The holes are in line. Space intervals are the same as for the Leds in the slide. Scale changing is achieved by moving the slide along the line of holes. At the same time, range changing for the converter is achieved by an electrical switch which selects different points along a voltage divider on the input to the A/D converter. The tongue of the switch is attached to the slide. Switch contacts are positioned on the faceplate.

DETAILS OF THE INVENTION

Figure 1:
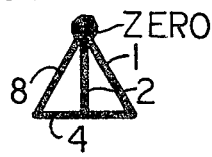
FIG. 1 is a sketch of a "computer compatible digit" as presently configured. This configuration is somewhat different from that of referenced co-pending Application 403 873.
Figure 2:
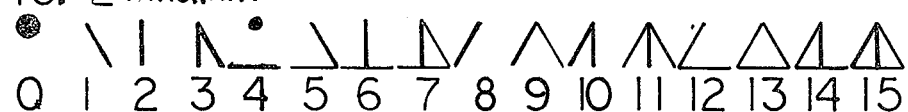
FIG. 2 is a sketch showing ccd's for the numbers 0–15.

An example of one type of ccd (computer compatible digit) indicia is shown in FIG. 1. The elements of the triangle are weighted as indicated. The sum of the weights is the number represented. The CCD of FIG. 1 represents the same number as is represented by Arabic decimal 15. Since the elemental weights are successive digits of the binary numbering system, such a digit may be formed directly from the output of a computer; or, the digit may be read by sensing the presence of the elements and feeding the result directly to a computer. Hence, the digit is "computer compatible". By selecting various combinations of elements from the triangle, various digits may be formed. Summing the weights corresponding to the elements present in the particular digit gives the number represented. Digits formable from the ccd range from 0 to 15 as indicated in FIG. 2. For further discussion of the system see copending U.S. Pat. application 403 873.

Figure 3:
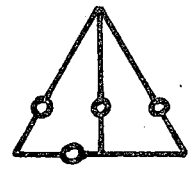
FIG. 3 is a sketch of a digit fitted with Leds and adapted for use in digital displays.

An economical digital display may be formed by placing Leds in the elements of the digits as indicated in FIG. 3. Lines representing the elements of the digit are drawn on a contrasting background. Leds are placed at the positions indicated by the dots. A particular digit is then represented by lighting the appropriate combination of Leds. Each lit Led indicates that the respective element is to be weighted. In an alternate embodiment and one preferred for use with TTL logic, the unlit Leds indicate elements to be weighted. Either mode may be used.

Figure 4:
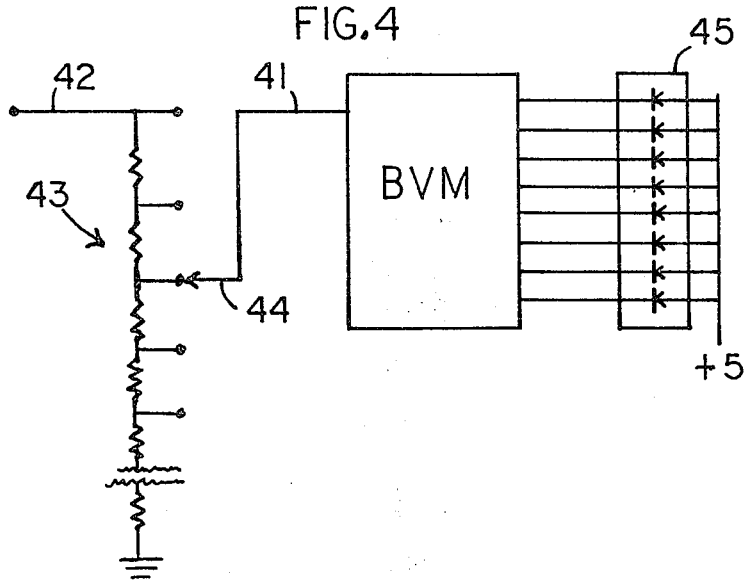
FIG. 4 is an electrical schematic of the preferred embodiment of the presnt invention.

FIG. 4 is a schematic of a BVM (binary voltmeter) in which the present invention may be used. The BVM may accept an input voltage at point 41. This voltage may be up to 1/16th of a volt. If the voltage at 42 is greater than this, the input voltage must be fed to a voltage divider and the input voltage to the BVM taken from an appropriate tap. Such a voltage divider is indicated by numeral 43. A switch arm for selecting an appropriate tap is indicated by numeral 44. The 8-bit output of the BVM feeds to Leds as indicated at 45. Knowing the setting of the voltage divider, the operator can note the Leds which are lite and determine the voltage input to the divider.

Convenient scale changing may be achieved by mounting the Leds on a slide in positions conforming to the positions of the dots in FIG. 3. In each digit of the display, holes may be placed at the positions of the dots. If the range of the voltmeter is changed by a factor of 16, the slide is merely moved one full digit.

However, from a resolution point of view, changing scales by a factor of 16 is worse than changing by a factor of 10. As pointed out earlier, it is preferable to change by a factor of 2. For this to be conveniently accomplished it is necessary that the Leds on the slide be in line and equally spaced.

Figure 5:
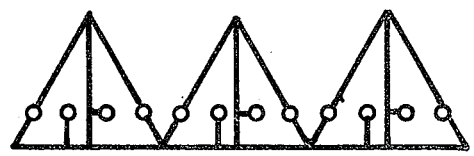
FIG. 5 is a sketch of three digits of configuration suitable for use with the present invention.

To permit the holes to be placed on line and equally spaced, the configuration of FIG. 5 is employed. The equilateral triangles are made contiguous and the line of holes placed at a height above the baseline equal to one-fourth the altitude of the triangles. A hole appears in each lateral side of each triangle. Each of these holes is associated with the side in which it appears. The elements with which the other two holes are to be associated are indicated by interconnecting lines.

Figure 6:
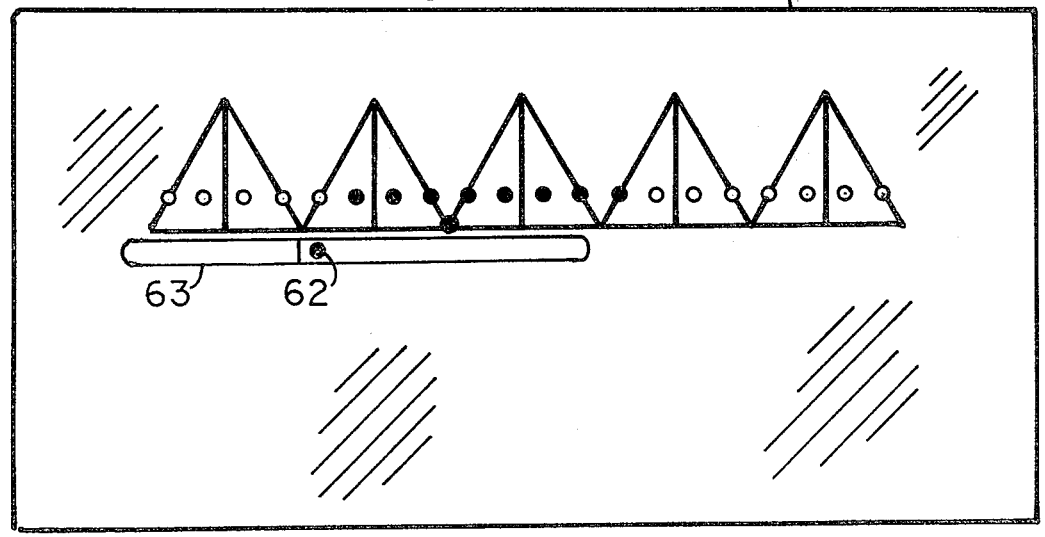
FIG. 6 is a frontal sketch of the faceplate of the preferred embodiment of the present invention.

The Leds in the slide may then be placed in line and equally spaced. Shifting the slide laterally one Led position changes scales by a factor of 2—as desired. Consider FIG. 6, a view of the faceplate of a BVM built in accordance with the present invention. Five ccd's appear. A "demarcation point" separating the fractional portion of the display from the integer portion appears between the second and third digits (counting from the left). The eight darkenned holes indicate the positions (for a particular scale setting) where Leds appear. The leftmost Led is behind the 4 hole of the units digit. Consequently the scale is set to 7 and 31/32 volts. Or, for all practical purposes, 8 volts.

If the slide is moved one position to the left, the 8-bit of the units digit will be picked up and the 8-bit of the 1/256 digit dropped. The new scale will be 16 volts.

If the slide is moved one position to the right, the new scale will be 4 volts.

If the slide is moved to its leftmost position the scale will be 256 volts.

If the slide is moved to its rightmost position, the scale will be 1/16th volt.

The advantage of this display is that it cannot be read incorrectly. There are no settings of switches to be noted and scales selected accordingly. The position of the demarcation indicator never changes. In using the instrument the operator moves the slide to the left until the most significant bit goes to zero. He then moves the slide to the right one position. This permits the maximum resolution of the instrument to be realized.

A second advantage results from use of the base-16 numbering system in conjunction with the four-element binary weighted digit. If the magnitude of the measurand is indicated by unlit Leds, then the lit Leds indicate the difference between the magnitude of the measurand and full scale. This is of particular advantage in those cases where readings are in fractional portions of a full scale value. Without resort to arithmetic the user can determine how far a reading is removed from either zero or full scale. This cannot be done in binary coded decimal systems without complicating matters by assigning a weight of 8 to the fourth element for readings above zero and a weight of 2 to that element for readings below full scale.

A post 62 affixed to the slide may be moved laterally by hand to effect scale changes. Post 62 moves in slot 63. To indicate scale, post 62 is placed one position to the left of the leftmost Led.

Figure 7:
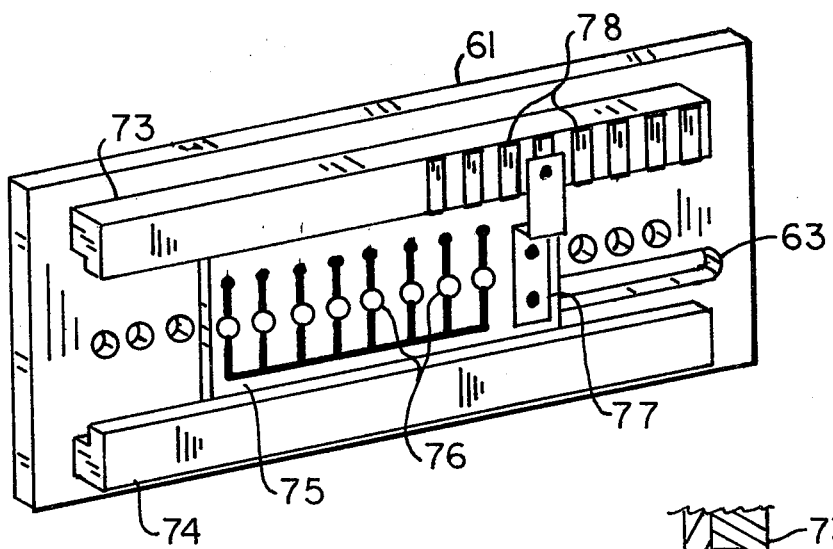
FIG. 7 shows the rear of the faceplate of the preferred embodiment.

FIG. 7 shows the rear of faceplate 61. Slide 75 is free to move in ways 73 and 74. Leds 76 are affixed to slide 75. Electrical connections (not shown) are made to Leds 76. Tongue 77 affixed to slide 75 presses successively against contacts 78 as slide 75 is moved from position to position. Contacts 78 may be detented to cause slide 75 to always fall to the center of the desired position. Electrical connections (not shown) are made to contacts 78 and tongue 77.

Figure 8:
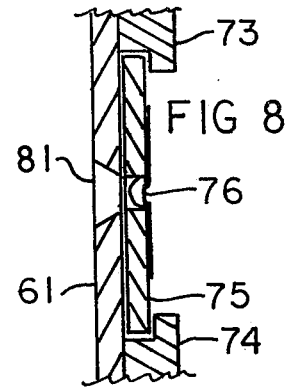
FIG. 8 is a sectional view of the faceplate of the preferred embodiment.

FIG. 8 is a partial crosssectional view of faceplate 61. Slide 75 carrying Led 76 moves in slots formed by ways 73 and 74. Slanted hole 81 permits Led 76 to be viewed from the front of faceplate 61.

Alternate methods for moving slide 75 are available. One method which has been used involves a pulley and belt system driven by a knob and capstan similar to the drives used in sliderule dials of conventional radios.

The number of bit positions in the display may vary from the 20 provided in the preferred embodiment. Units have been built having 40 positions.

The combined display and range changing system may be used for instruments other than a BVM. In any measuring instrument for which the range of input signal exceeds the useful range of the instrument, range changing will be desirable. In each such case it becomes desirable to change display scale simultaneously with change in input range. In each of these cases the present invention may be used to advantage.

Figure 9:
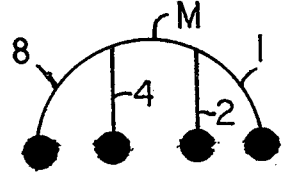
FIG. 9 is a sketch of an alternate digital configuration suitable for use with the present invention.
Figure 10:
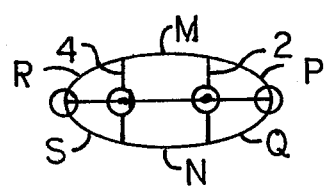
FIG. 10 is a sketch of a second alternate digital configuration suitable for use with the present invention.

Other configurations for the display digits may be used. The most basic variation is to use no digits at all. Use the straight binary numbering system and weight the display positions accordingly. This system has been used for a number of years in fixed position binary displays. A prime variation involves the octal (base-8) system of numbering. An octal digit might consist of the two lateral sides and the altitude of the triangle of the preferred embodiment. The three Leds necessary for proper representation of the octal system could then appear in their respective lines. No guide lines would be required as are required for the 2 and 4 bits of the presently preferred base-16 digit. It is also apparent that many other configurations of a base-16 digit may be used other than the triangle with altitude dropped to the base. Several of these variations permit the Leds to appear in their respective elements while still lying in a straight line and being equally spaced. One such variation appears in FIG. 9. The four dots indicate equally spaced, in-line Led positions. The weighting of the various segments is indicated. Section $m$ is unweighted and is included in a digit only when necessary to make the digit contiguous. In writing the digits by hand the pencil need by lifted from the paper for the 7, 11, 13, 14, and 15. This does not compare favorably with the triangular digit for which the pencil must be lifted for only the 6 and 11. If the configuration of FIG. 10 were adopted, all digits could be formed without lifting the pencil from the paper. A one is represented by section $p$, $q$, or both. An 8 is represented by $r$, $s$, or both. A 4 may be represented by the upper section, lower section, or both. A 2 may be represented by the upper section, lower section, or both. Section $m$ , or section *n*, or both may be included to render the digit contiguous. Many other such variations exist.

The system may be used with the decimal numbering system. The maximum count displayable by any digit becomes 9. The same computer compatible digits may be used. However, range changing is not as simple as above indicated. Scale changing becomes very complicated. Consequently the application of the system to a decimal measuring instrument becomes exceedingly cumbersome. This increased complexity and attendant decreased utility discourages further consideration of such an instrument and reinforces the conclusion that the decimal system should be retired in favor of a computer compatible base-16 system.

Experience with the BVM above discussed revealed another benefit resulting from use of the base-16 system. The BVM above discussed used negative logic—the Leds were all lit for an input of zero and dark for a full scale input. Full scale input was a positive voltage. Consequently the basic voltmeter could read positive voltages only. To read negative voltages a positive bias was applied to the BVM. This bias caused the BVM to read full scale for an input voltage of zero. All Leds were dark. Application of negative input voltages caused subtraction from the full scale reading. This subtraction was indicated by the lit Leds in the display. Consequently, the following rules held:

1. To read positive voltages, apply no input bias, read the Leds which are dark.
2. To read negative voltages, apply a full-scale input bias and read the Leds which are lit.

If it was desired to read both positive and negative voltages, an input bias of half-scale was applied. The most significant bit then become a sign bit. In reading the voltmeter the user noted the sign Led. If it were lit, a negative voltage was being read. The magnitude of the voltage was indicated by the lit Leds in the remainder of the display. If the sign Led were dark, a positive voltage was being read. The magnitude was indicated by the dark Leds in the remainder of the display. Since one bit was given up to provide sign information, resolution for the bipolar system was half that for the unipolar system.

The above discussed simple system for reading voltages of different polarity cannot be used with the base-10 or any other non-binary derived numbering system. The above system offers another significant technical advantage associated with the base-16 system. The advantage further indicates that the base-10 system should be retired in favor of the presently discussed computer compatible system.

I claim:

1. In a measuring instrument having a plurality of input ranges and providing as intermediate output a set of signals forming a binary numbering system representation of the magnitude of the measurand;
in combinaton, a digital display and range selector comprising a slide, a faceplate, and a switch;
said slide bearing a plurality of indicators placed in line and equally spaced, each of said indicators taken in order being operatively associated with a respective signal of the set of intermediate signals taken in order, each of said indicators being adapted for assuming a first visible condition when said respective signal is a zero and for assuming a second and different visible condition when said respective signal is a one, said slide and said faceplate having associated therewith means for causing said slide to move in a path behind said faceplate, said path being parallel to said line of indicators; said faceplate being operatively associated with said slide and adapted for exposing said indicators to view, said faceplate bearing indicia juxtaposed the path of said indicators, said indicia being spaced at intervals equal to the intervals between said indicators, each indicium of said indicia signifying a numerical weight to be associated with any indicator occupying a position opposed said indicium, said numerical weights associated with said indicia taken in order forming a geometric progression having a common ratio of 2, the sum of said weights associated with indicia opposed by indicators in said slide for any particular position of said slide indicating the scale of said display; and said switch being operatively associated with said slide and adapted for selecting for the measuring instrument an input range corresponding to said scale.
2. A combination as in claim 1;
said indicia being base-16 digits of the form shown in FIGS. 1, 5, and 6.
3. A combination as in claim 1;
said switch being comprised of a tongue affixed to said slide and a set of contacts affixed to said faceplate, said tongue being adapted for successively contacting said contacts as said slide is moved along said path.
4. A combination as in claim 1;
said means associated with said slide being a post affixed to said slide and adapted for being moved by the operator of the instrument.
5. A combination as in claim 4;
said post being positioned on said slide such that its position relative to said indicia on said faceplate indicates the scale setting of the instrument.

* * * * *

UNITED STATES PATENT OFFICE
CERTIFICATE OF CORRECTION

Patent No. 3,974,444                Dated August 10, 1976

Inventor(s) Ranald O. Whitaker

It is certified that error appears in the above-identified patent and that said Letters Patent are hereby corrected as shown below:

Column 1, line 40, "object" should read -- objection --.

Column 3, line 4, "lite" should read -- lit --.

Signed and Sealed this

Twelfth Day of October 1976

[SEAL]

Attest:

RUTH C. MASON
Attesting Officer

C. MARSHALL DANN
Commissioner of Patents and Trademarks